(12) United States Patent
Nishri et al.

(10) Patent No.: US 11,749,551 B2
(45) Date of Patent: Sep. 5, 2023

(54) CHUCK FOR ACQUIRING A WARPED WORKPIECE

(71) Applicant: Core Flow Ltd., Daliyat el-Karmel (IL)

(72) Inventors: Boaz Nishri, Kibbutz Maagan Michael (IL); Ami Herman, Shimshit (IL); Nir Gurarye, Kfar Tavor (IL); Yaacov Legerbaum, Haifa (IL); Igor Birger, Haifa (IL); Alon Segal, Kiriyat Tivon (IL); Mart Genender, Lod (IL); Ronen Lautman, Haifa (IL)

(73) Assignee: Core Flow Ltd., Daliyat el-Karmel (IL)

( * ) Notice: Subject to any disclaimer, the term of this patent is extended or adjusted under 35 U.S.C. 154(b) by 0 days.

(21) Appl. No.: 17/169,930

(22) Filed: Feb. 8, 2021

(65) Prior Publication Data

US 2022/0250167 A1    Aug. 11, 2022

(51) Int. Cl.
*H01L 21/683* (2006.01)
*B23B 31/30* (2006.01)
*F25B 9/14* (2006.01)

(52) U.S. Cl.
CPC ........ *H01L 21/6838* (2013.01); *B23B 31/307* (2013.01); *F25B 9/14* (2013.01)

(58) Field of Classification Search
CPC . B23B 31/307; Y10T 279/11; H01L 21/6838; H01L 21/6875; H01L 21/67288
See application file for complete search history.

(56) References Cited

U.S. PATENT DOCUMENTS

| | | | | |
|---|---|---|---|---|
| 1,121,452 A * | 12/1914 | Bagnall | ................... | B24B 37/30 451/388 |
| 2,782,574 A * | 2/1957 | Copold | ................. | B25B 11/005 29/DIG. 44 |
| 5,564,682 A * | 10/1996 | Tsuji | ................... | H01L 21/6838 269/21 |
| 5,879,040 A * | 3/1999 | Nagai | ..................... | F16B 47/00 279/3 |
| 5,937,993 A * | 8/1999 | Sheets | .................. | B25B 11/005 269/21 |
| 6,644,703 B1 * | 11/2003 | Levin | ................... | B25J 15/0616 279/3 |
| 7,603,028 B2 * | 10/2009 | Yassour | .................. | H01L 21/00 118/725 |
| 9,233,455 B2 * | 1/2016 | Ooi | ..................... | H01L 21/6838 |
| 10,861,735 B2 * | 12/2020 | Heo | ................. | H01L 21/67288 |
| 2006/0055073 A1 | 3/2006 | Fayaz et al. | | |

(Continued)

OTHER PUBLICATIONS

International Search Reprot for PCT Applicatiohn No. PCT/IL2022/050010 dated PCT/IL2022/050010 dated May 1, 2022.

(Continued)

*Primary Examiner* — Eric A. Gates
(74) *Attorney, Agent, or Firm* — PEARL COHEN ZEDEK LATZER BARATZ LLP

(57) ABSTRACT

A chuck includes a chuck surface, a plurality of vacuum ports being distributed over the chuck surface. Each of the vacuum ports is open to a conduit that is connectable to a suction source that is operable to apply suction to that vacuum port. A flow restrictor is located within each conduit and is characterized by a flow resistance. The flow resistance of the flow restrictor in at least one conduit is less than the flow resistance of the flow restrictor in at least one other conduit.

9 Claims, 6 Drawing Sheets

(56) References Cited

U.S. PATENT DOCUMENTS

| | | | |
|---|---|---|---|
| 2010/0195080 A1* | 8/2010 | Compen | H01L 21/6838 |
| | | | 414/800 |
| 2011/0023757 A1* | 2/2011 | Richman | B65H 5/22 |
| | | | 108/50.13 |
| 2014/0065553 A1* | 3/2014 | Jang | H01L 22/12 |
| | | | 279/3 |
| 2017/0192359 A1* | 7/2017 | Leenders | G03F 7/707 |
| 2017/0294333 A1 | 10/2017 | Iu et al. | |
| 2018/0082880 A1* | 3/2018 | Komine | H01L 21/68735 |
| 2018/0166314 A1* | 6/2018 | Ellis | H01L 21/6875 |
| 2018/0315638 A1* | 11/2018 | Kikuchi | H01L 21/6838 |
| 2019/0333800 A1 | 10/2019 | Heo et al. | |

OTHER PUBLICATIONS

International Search Reprot for PCT Applicatiohn No. PCT/IL2022/050431 dated Jun. 8, 2022.

\* cited by examiner

CHUCK FOR ACQUIRING A WARPED WORKPIECE

FIELD OF THE INVENTION

The present invention relates to chucks for holding a workpiece. More particularly, the present invention relates to a chuck that is operable to acquire a warped workpiece.

BACKGROUND OF THE INVENTION

Many types of industrial or other processes require manipulation of various types of workpieces. Typically, a chuck is used to acquire the workpiece and to manipulate the workpiece for various types of processing. Where the workpiece is sufficiently thin or light, the chuck may operate by applying suction to the workpiece in order to hold the workpiece at a precisely defined location during processing.

For example, the semiconductor industry requires manipulation of silicon wafers, e.g., for production of electronic devices. A vacuum chuck may acquire such a wafer and hold it during processing such as coating, cutting, machining, etching, polishing, inspection, or other processing.

SUMMARY OF THE INVENTION

There is thus provided, in accordance with an embodiment of the present invention, a chuck including: a chuck surface, a plurality of vacuum ports being distributed over the chuck surface, wherein each of the vacuum ports is open to a conduit of a plurality of conduits that are connectable to a suction source that is operable to apply suction to that vacuum port; and a flow restrictor located within each conduit of the plurality of conduits and characterized by a flow resistance, the flow resistance of the flow restrictor in at least one conduit of the plurality of conduits being less than the flow resistance of the flow restrictor in at least one other conduit of the plurality of conduits.

Furthermore, in accordance with an embodiment of the present invention, the chuck surface is divided into a plurality of contiguous regions, the flow resistances of the flow restrictors in the conduits that are open to the vacuum ports in each contiguous region are substantially equal.

Furthermore, in accordance with an embodiment of the present invention, the plurality of contiguous regions include a plurality of concentric circular bands.

Furthermore, in accordance with an embodiment of the present invention, the flow resistances of the flow restrictors in each of the conduits that are open to the vacuum ports in an inner concentric circle are less than the flow resistances of the flow restrictors in each of the conduits that are open to the vacuum pork in an outer concentric circle.

Furthermore, in accordance with an embodiment of the present invention, the flow resistances of the flow restrictors in each of the conduits that are open to the vacuum ports in an outer concentric circle are less than the flow resistances of the flow restrictors in each of the conduits that are open to the vacuum ports in an inner concentric circle.

Furthermore, in accordance with an embodiment of the present invention, the plurality of contiguous regions include a plurality of circle sectors.

Furthermore, in accordance with an embodiment of the present invention, the flow restrictor is selected from a group of flow restrictors consisting of a constriction, a baffle and a self-adapting segmented orifice (SASO).

Furthermore, in accordance with an embodiment of the present invention, each of the vacuum ports is surrounded by ridges.

Furthermore, in accordance with n embodiment of the present invention, the chuck surface further includes a plurality of projections that are interspersed with the vacuum ports.

Furthermore, in accordance with an embodiment of the present invention, a vacuum port of the plurality of vacuum ports includes an extendible tube whose distal end is configured to form a seal when in contact with the workpiece, and that is configured to be compressible by the suction after formation of the seal.

Furthermore, in accordance with an embodiment of the present invention, the extendible tube is in the form of a bellows with accordion folds.

There is further provided, in accordance with an embodiment of the present invention, a chuck including: a chuck surface, a plurality of vacuum ports being distributed over the chuck surface; a plurality of conduits, wherein each conduit is open to at least one vacuum port of the plurality of vacuum ports and is connectable to a suction source that is operable to apply suction to the at least one vacuum port; a sensor to sense inflow through each of the conduits; a plurality of valves, each valve being operable to enable or disable inflow through at least one of the plurality of conduits; and a controller that is configured to receive a signal from the sensor and, when the sensor indicates reduced inflow through some vacuum ports of the plurality of vacuum ports, indicative of acquisition of a warped workpiece by the some vacuum ports, and non-reduced inflow through at least one other vacuum port of the plurality of vacuum ports, indicative of failure to acquire the warped workpiece by the at least one other vacuum port, to operate at least one valve of the plurality of valves so as to disable inflow through at least one vacuum port of the at least one other vacuum port.

Furthermore, in accordance with an embodiment of the present invention, the sensor includes a flowmeter.

Furthermore, in accordance with an embodiment of the present invention, the reduced inflow is indicated by a sensed rate of flow that is less than a predetermined threshold flowrate.

Furthermore, in accordance with an embodiment of the present invention, the sensor includes a pressure sensor.

Furthermore, in accordance with an embodiment of the present invention, the reduced inflow is indicated by a sensed fluid pressure that is below a predetermined threshold pressure.

Furthermore, in accordance with an embodiment of the present invention, each vacuum port is surrounded by a flexible cup that is configured to form a seal between the workpiece and that vacuum port.

Furthermore, in accordance with an embodiment of the present invention, each vacuum port includes a pin to limit local bending of the workpiece when acquired by that vacuum port.

Furthermore, in accordance with an embodiment of the present invention, the at least one other vacuum port includes a plurality of vacuum ports, the controller being further configured, after disabling inflow through the at least one vacuum port of the at least one other vacuum port, to determine whether inflow has been reduced through at least one additional vacuum port of the at least one other vacuum port.

Furthermore, in accordance with an embodiment of the present invention, the controller is further configured to, upon determining that the inflow has been reduced through the at least one additional vacuum port, enable inflow through at least one vacuum port through which inflow was previously disabled.

BRIEF DESCRIPTION OF THE DRAWINGS

In order for the present invention to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1A:
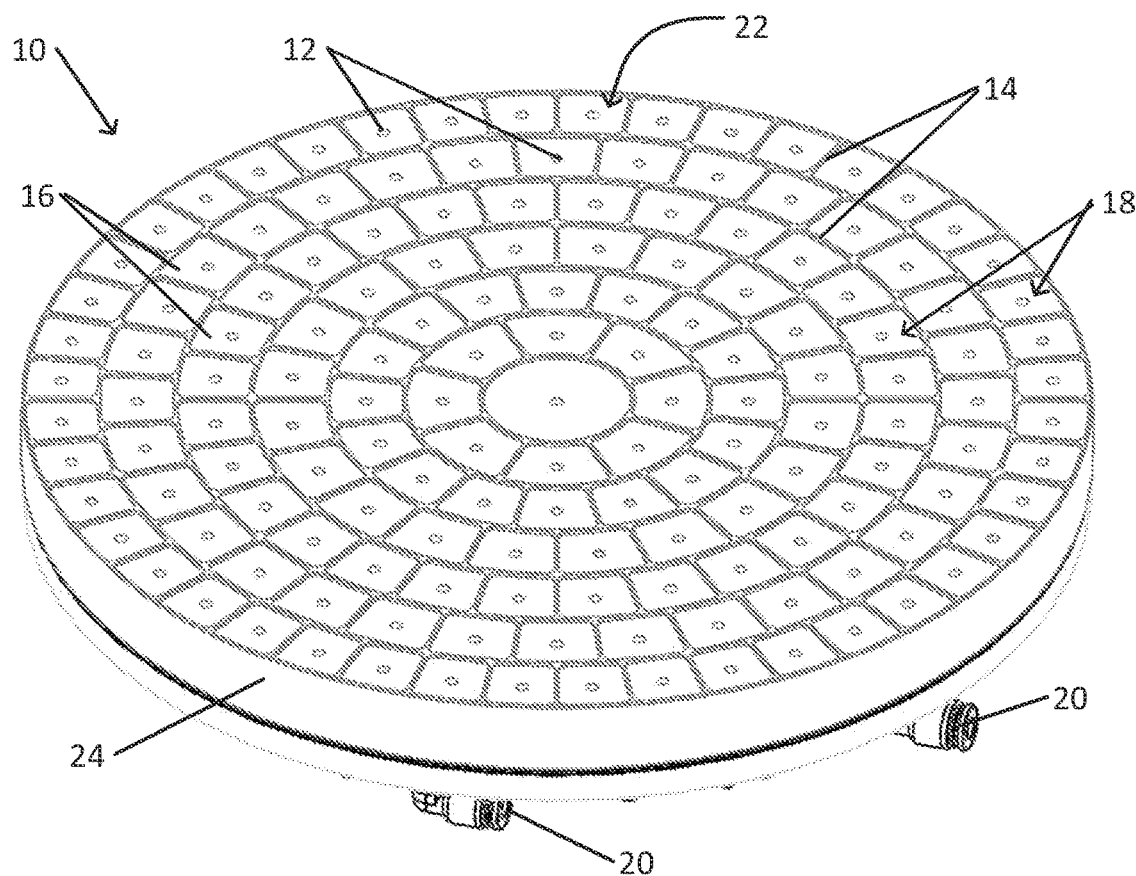
FIG. 1A schematically illustrates an example of a chuck that is configured to flatten a warped workpiece, according to some embodiments of the invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

In accordance with an embodiment of the present invention, a chuck is configured to acquire and hold a warped workpiece. For example, the workpiece may be a silicon wafer that is to be processed for incorporation into one or more electronic components, a thin pane of glass (e.g., for incorporation into a touchscreen or display screen), or other types of substrates that may become warped during their formation or subsequent handling. The warping may exhibit concave curvature along one or two axes, convex curvature along one or two axes, or a mixture of concave and convex curvatures, such as in a wavy surface or saddle shape. References herein to concave and convex curvatures of the workpiece refer to the surface of the workpiece that faces and is viewed from the chuck, and that is to be acquired and held by the chuck.

A chuck, according to some embodiments of the invention, includes a plurality of vacuum ports that are distributed over a grasping surface of the chuck. Each of the vacuum ports is connected to a suction source that is operable to apply suction to the vacuum ports. The suction source may include a pump, blower, or other type of device for generating pneumatic suction. All of the vacuum ports may be connected to the same suction source. Alternatively, different subsets of vacuum ports may be connected to different suction sources.

A distribution pattern of the vacuum ports over the grasping surface may be designed in accordance with the type of workpiece with which that chuck is to be used, and which may include any anticipated warpage, e.g., dictated by the type of workpiece or the actual warpage of an individual workpiece. For example, a sensor may be operated to sense the topography of the surface of a particular workpiece. A controller of a system that includes a plurality of chucks may select a chuck that is configured or optimized for that type of workpiece for efficient grasp and manipulation of that workpiece.

A tube or conduit that connects each vacuum port to the suction source may include one or more valves, flow restrictors (e.g., constrictions or narrowing, baffles, self-adapting segmented orifice (SASO) flow restrictors, or another type of flow restrictor), vacuum or flow sensors, or other components for modifying, controlling, or monitoring inflow through the vacuum port. The strength of the suction that is applied via each vacuum port, also referred to herein as the vacuum level of that vacuum port, may depend on the types and numbers of flow restrictors, as well as on the state of any valves, in the fluidic path between the suction source and that vacuum port. As used herein, a vacuum or suction level of a vacuum port may be quantified by a rate of inflow through the vacuum port when the vacuum port is uncovered, or by a level of vacuum within the port when the port is covered so as to prevent inflow.

In some embodiments of the invention, the chuck may be configured to flatten a warped workpiece. Different contiguous regions of the chuck may be designed to have different rates of inflow through the vacuum ports in order to achieve the flattening. Different rates of inflow may be accomplished by providing the vacuum ports in the different regions with flow restrictors having different flow resistances. For example, the flow resistance may be relatively (as compared to other regions of the chuck surface) high, resulting in a relatively low rate of inflow in regions of the chuck surface where the surface of the warped workpiece is expected to be initially relatively close to the chuck surface. On the other hand, in regions of the chuck surface where the warping of the workpiece is expected to result in a larger initial gap between the workpiece surface and the chuck surface, the flow resistance may be relatively low in order to enable a relatively high rate of inflow. The resulting increased rate of inflow in the regions of the chuck surface with the relatively large initial gap may cause increased suction to be applied to the more distant regions of the workpiece. The increased suction may thus bend the initially distant regions of the workpiece toward the chuck surface.

For example, under some circumstances, an elastic modulus of the workpiece may resist bending by a value that is proportional to a bending angle of the workpiece. Where the bending angle is small, a local bending angle in a region of the workpiece may be proportional to a change in distance of the local region of the workpiece from the chuck surface. On the other hand, under some circumstances, the suction force that is applied to the workpiece by a vacuum port may be inversely proportional to a cube of the local distance between the local region of the workpiece and the chuck surface. The suction flowrate required to flatten a workpiece to a chuck surface may scale with the cube of the local distance between the local region of the workpiece and the chuck surface. Thus, under these circumstances, an initial bending of the workpiece surface toward the chuck surface may be self-reinforcing so as to flatten the workpiece surface against the chuck surface.

In some embodiments of the invention, the chuck surface may be circular. In some embodiments, each contiguous regions of the chuck, within which the rates of flow through the vacuum ports of the region are substantially uniform, may include a plurality of concentric circular bands or annuli at different distances from the center of the circular chuck surface. In other embodiments, the contiguous regions may include a plurality of circle sectors at different azimuths about the center of the chuck surface.

According to some embodiments of the invention, the chuck surface may be divided into an arrangement of cells. Each cell may be surrounded by a closed perimeter of a raised ridge or ridges (hereinafter ridges) and may include at least one vacuum port within the raised ridges. Thus, when a section of the workpiece surface lies in contact with the ridges that surround one of the cells, the contact with the ridges may form a seal. Thus, the suction that is applied within the volume that is bounded by the workpiece surface, the surrounding ridges, and the chuck surface may hold that section of the workpiece to that cell of the chuck. When the vacuum level within the volume approaches the level of the volume of the suction source, the rate of inflow through a vacuum port within this volume may approach zero. The suction source, continuing to operate at its previous capacity, may then apply increased suction to the vacuum ports in other cells of the chuck.

The dimensions and locations of the cells, the thicknesses and heights of the ridges, and other characteristics of the chuck surface may be determined by one or more considerations. For example, the total area of the workpiece that is allowed to physically contact the chuck surface may be limited, e.g., due to considerations related to quality control of the workpiece process, thus limiting the fraction of the chuck surface that may be physically in contact with the ridges. Distances between ridges surrounding a cell and their heights, as well as the level of the vacuum that is applied to the vacuum port or ports in that cell, may be limited by limits on local bending of section of the workpiece that covers that cell. Other limitations may be imposed by manufacturability and cost limitations in producing the chuck surface. Vacuum ports may be located anywhere within the cell.

For example, a chuck, according to some embodiments of the invention, may be designed to acquire and flatten a workpiece with concave warping (e.g., dome-shaped). In this case, the cells of the chuck may be designed such that the suction is greater in cells near the middle of the chuck (where the domed workpiece surface is further from the chuck surface) than in cells near the edges of the chuck (where the dome-shaped workpiece is nearest to the chuck surface). For example, the flow resistance of the vacuum ports of the cells in the middle of the chuck surface may be smaller than the flow resistances of the cells near the edge of the chuck. Thus, the center of the workpiece may be drawn toward the chuck surface, where it may be acquired by cells near the center of the chuck.

Similarly, a chuck may be designed to acquire and flatten a workpiece with convex warping (e.g., a bowl shape). In this case, the cells of the chuck may be designed such that the suction is greater in cells near the edges of the chuck (where the bowl-shaped workpiece surface is further from the chuck surface) than in cells near the center of the chuck (where the bowl-shaped workpiece is nearest to the chuck surface). For example, the flow resistance of the vacuum ports of the cells near the edges of the chuck surface may be less that the flow resistance of the cells near the center of the chuck. Thus, the edges of the workpiece may be drawn toward the chuck surface, where they may be acquired by cells at the edges of the chuck.

In some embodiments of substantially circular chucks, the cells along a radius may have similar flow restrictors, while cells at different azimuths may have different flow restrictors. Thus, the cells at azimuths that allow more inflow may acquire corresponding radial sections of a convex workpiece. When the workpiece rim is thus bent toward the chuck surface, cells at neighboring azimuths with lower inflow rates may then be enabled to acquire the workpiece.

In some embodiments, the chuck may be configured such that the rate of inflow through each cell may depend on one or more of its radial position or its angular or azimuthal position.

In some examples, the flow restrictors that provide the flow resistance to each vacuum port may be located in a conduit that forms a fluidic connection between that vacuum port and the suction source. In this case, a chuck for holding a particular workpiece may be selected on the basis of the type of warping of that workpiece. For example, a batch of workpieces may be Characterized by a particular form of warping (e.g., concave or convex). Prior to operation of a processing system to process that batch of workpieces, chucks that are designed for that type of warping may be attached to (e.g., by an operator of), or activated by a controller of, the system. In another example, the system may be configured to concurrently or selectively operate a plurality of chucks that are designed for workpieces that are warped in different ways. One or more sensors of the system may be configured to sense the warping of each workpiece, e.g., at or near an entry point to the system. A controller of the system may then select a chuck that has been designed for the sensed warping in order to acquire and manipulate that workpiece.

In some embodiments of the invention, a single flow restrictor may provide the flow resistance for a group of neighboring or otherwise arranged subset of the vacuum ports. For example, the flow restrictor may be located in a conduit that branches out to form a fluidic connection between the vacuum ports of the subset of vacuum ports and the suction source. In some examples of this case, an arrangement of valves or other structures may be operated to cause the inflow through the subset of vacuum ports to pass through a selected flow restrictor of two or more different flow restrictors. (In some embodiments, e.g., where components of the chuck are sufficiently minimized, such selection of flow resistance may be enabled for each individual vacuum port.) In this case, a single chuck may be configurable for different warpage of workpieces. For example, one or more sensors of a processing system that includes the configurable chuck may be operated to sense the warping of each workpiece that are to be held by the chuck. A controller of the system may be configured to select a flow restrictor for each of the groups of vacuum ports in order to configure the chuck to optimally acquire and manipulate the workpiece with the sensed warpage.

A chuck in which vacuum ports in different regions of the chuck have different initial rates of inflow due to flow restrictors with different flow resistances may be advantageous in handling a warped workpiece. In using a conventional chuck where the suction level that is applied to all vacuum ports is uniform, the suction that would be required to acquire and flatten a warped workpiece could exceed or strain the capacity of its suction source, or a strong suction source may be required. On the other hand, use of a chuck in accordance with an embodiment of the present invention, in which the rates of inflow through different vacuum ports are designed to acquire and flatten a warped workpiece, may efficiently utilize the suction that is provided by a suction source to acquire and flatten a warped workpiece.

In the example of a circular chuck, division of the vacuum ports into regions with different flow resistances and inflow rates may be by radius, where all vacuum ports at a common distance from the center of the chuck surface have substantially equal flow resistances, or by azimuth, where all vacuum ports within a given circle sector of the chuck surface have substantially equal resistances.

In one example, the vacuum ports may be divided by radius into an inner section and an outer section, where the rate of inflow through each vacuum port in the outer section is initially greater than the rate of inflow through each vacuum port in the inner section.

If the member of vacuum ports in the inner and outer sections are approximately equal and flow resistance in the inner section is 10 times the flow resistance in the outer section, according to calculations approximately 91% of the inflow may initially flow through the vacuum ports in the outer section. Similarly, if the flow resistance in the inner section is 5 times or 3 times the flow resistance in the outer section, according to calculations approximately 83% or 75%, respectively, of the inflow may initially flow through the vacuum ports in the outer section.

In another example, the number of vacuum ports in the outer section is one third of the number of vacuum ports in the inner section. In this example, if the flow resistance in the inner section is 10, 5, or 3 times the flow resistance in the outer section, according to calculations approximately 71%, 56%, or 43%, respectively, of the inflow may initially flow through the vacuum ports in the outer section.

In another example, the vacuum ports may be divided by azimuth into a first region (circle sector) containing about 25% of the vacuum ports, and a second region containing about 75% of the vacuum ports. If the flow resistance to each vacuum port in the second region is 3 times the flow resistance to each port in the first region, according to calculations approximately 50% of the inflow may initially flow through the vacuum ports in the first region.

Similar calculations may be made for division of the vacuum ports into more than two regions, radially or azimuthally.

Alternatively or in addition to providing different flow resistances to different vacuum ports or subsets of vacuum ports, a chuck may be configured to increase the suction that is applied to acquire and hold a warped workpiece without flattening the workpiece. For example, a chuck may be configured to dynamically adjust the rate of inflow through each vacuum port in order to maximize the suction that is applied to those vacuum ports that have acquired a region of the workpiece. This may be effected by minimizing or blocking inflow through those vacuum ports that did not acquire the workpiece, and that would otherwise suck in air or other gas from the ambient atmosphere.

For example, each vacuum port (or a conduit that forms a fluidic connection between the vacuum port and the suction source) may be provided with one or more sensors (e.g., flow sensors) and a valve. Initially, the valves of all of the vacuum ports may be opened. The sensors of each vacuum port may be configured to sense one or more of a rate of inflow through the vacuum port, a level of a vacuum that is formed within the port, or another value that is indicative of whether the vacuum port has acquired the workpiece surface.

A controller of the chuck may receive signals from the sensors drat may be analyzed or interpreted to indicate as to whether each vacuum port has acquired the workpiece surface. The controller is configured to close the valve of each vacuum port that has not acquired the workpiece surface. In this manner, the suction of the suction source is applied to only those vacuum ports that are in contact with the workpiece surface.

In some embodiments, the controller may be configured to close only some (e.g., at least one) of the valves of the vacuum ports that have not acquired the workpiece. The increased suction through the open vacuum ports may increase the likelihood of those vacuum ports acquiring the workpiece. If the workpiece is not acquired by more vacuum ports, e.g., within a predetermined period of time, the valves of all vacuum ports that have not acquired the workpiece may be closed.

Thus, the force that holds that workpiece to the chuck may be stronger than the force that would be applied without blocking inflow through vacuum ports that remain open to the ambient atmosphere.

For example, when a vacuum port acquires the workpiece surface, contact between the workpiece surface and the section of the workpiece surface that surrounds the vacuum port may form a substantially airtight barrier that impedes or significantly reduces inflow through the vacuum port. Therefore, a flow sensor may detect a significant (e.g., determined by a previously determined threshold value) decrease in the rate of inflow through the vacuum port. Similarly, a vacuum sensor may detect a significant (e.g., determined by a previously determined threshold value) increase in the vacuum level within the vacuum port.

On the other hand, one or more vacuum ports may not acquire the workpiece surface. For example, warping of the workpiece may cause the workpiece surface to bend away from those vacuum ports, leaving a sufficiently large air gap between the vacuum port and the workpiece surface, Thus, air or other gas from the ambient atmosphere may flow inward through those uncovered vacuum ports substantially unimpeded (e.g., relative to the inflow through those vacuum ports that have made contact with and acquired the workpiece surface).

When both vacuum ports that have acquired the workpiece surface and those that have not are connected to a common suction source, inflow through the vacuum ports that have not acquired the workpiece surface is relatively unimpeded. The ease of inflow through those unblocked vacuum ports could reduce the suction (and, thus, friction) forces that are applied through the vacuum ports that have acquired the workpiece surface.

In order to strengthen the force with which the workpiece is grasped, the controller is configured to close a valve of each vacuum port that has not acquired the workpiece. In this manner, the controller is configured to prevent or reduce unimpeded inflow through those vacuum ports. Therefore, all of the suction that is applied by the suction force is applied only to those vacuum ports that have acquired a part of the workpiece surface and are currently covered by the workpiece. Therefore, the suction, and thus friction forces, that are applied to the workpiece via the covered vacuum ports may be increased, improving the tightness of the grip of the chuck on the workpiece. Increased tightness of the grip may increase the accuracy and reproducibility of manipulation of the workpiece as performed by the chuck. Furthermore, the increased tightness of the grip may reduce the likelihood of the workpiece slipping along the chuck surface or falling away from the chuck surface.

A chuck may be designed to distribute inflow over its surface in order to accommodate a warped workpiece. The inflow distribution may, in some cases, be designed to flatten the workpiece against the chuck surface in order to achieve more uniform distribution of suction forces on the workpiece. In other cases, the inflow distribution may be adjustable during use in order to limit suction to vacuum ports that have been covered by the workpiece so as to firmly hold a warped workpiece without altering its shape.

Use of a chuck designed for a warped workpiece when handling a warped workpiece may be advantageous over use of a conventional chuck that was designed for flat workpieces. In order for a chuck to firmly and reliably hold and manipulate a warped workpiece, the suction that is applied must be sufficient to hold the workpiece firmly to the chuck surface. A conventional chuck would require a high rate of inflow in order to firmly hold a warped workpiece where there are gaps between the chuck surface and the warped workpiece surface. In many cases, the total rate of inflow that may be generated by the suction source may be limited. Thus, a conventional chuck may not be capable of reliably manipulating such a warped workpiece.

On the other hand, a chuck that is designed with adjustable distribution of inflow may apply a larger level of suction to where such large suction may be most needed to flatten or hold the workpiece, while applying a lower level of suction to where such low level is sufficient, or no suction to a vacuum port that is not in contact with any part of the workpiece surface. Thus, the limited total inflow of the suction source is directed in order to firmly hold the warped workpiece.

In some applications, physical contact of the workpiece with ridges of cells may be considered excessive, e.g., due to extreme sensitivity of the workpiece to contamination. On the other hand, such a workpiece, e.g., a semiconducting wafer, may not be sensitive to contact in an exclusion zone at the edges of the workpiece (e.g., typically about 3 mm wide). For such applications, a chuck surface may include thin protrusions (e.g., pins or columns) that extend outward from the chuck surface to provide an acceptably small contact area with the workpiece. Typically, the protrusions are interspersed with the vacuum ports on the chuck surface. A rim of the chuck may be raised above the chuck surface in order to facilitate contact of the rim with the exclusion zone of the workpiece. When the workpiece and the rim of the chuck conic into contact with each other, a seal might form between the two, allowing vacuum to deepen in the volume that is enclosed by the chuck surface, the raised rim and the workpiece. The resulting suction may pull the workpiece toward the chuck surface to rest on the protrusions. The sizing and spacing between protrusions may be designed in accordance with mechanical properties and processing requirements of the workpiece mechanical properties, e.g., to prevent local sagging or bending more than a predefined threshold. The rim of the chuck may be constructed of metal, ceramic, polymer, or another suitable material. For example, the material of the rim may be informed by the sensitivity of the workpiece to contamination, scratching, or other damage or degradation. The material and shape of the rim may be informed by a requirement that the rim adjust its shape to follow the contour of the workpiece in order to form a seal.

In some embodiments, one or more of the vacuum ports may each be provided with extendible and retractable sealing structure in the form of a bellows. For example, each bellows may include a tube that is made of a flexible material whose sides form a series of azimuthal accordion folds that are distributed along the length of the tube. Each bellows may be configured such that, when not in contact with a workpiece, the bellows is fully extended. Each bellows may be configured such that, when a seal is formed between a distal end of the bellows and the workpiece, the suction pulls the workpiece toward the chuck surface, thereby at least partially collapsing the bellows. The collapsing of the bellows enables the workpiece to come into contact with other, similarly configured bellows, with protrusions, with cell ridges, or with other structure that prevents excessive contact area between the workpiece and the chuck surface.

Figure 1B:
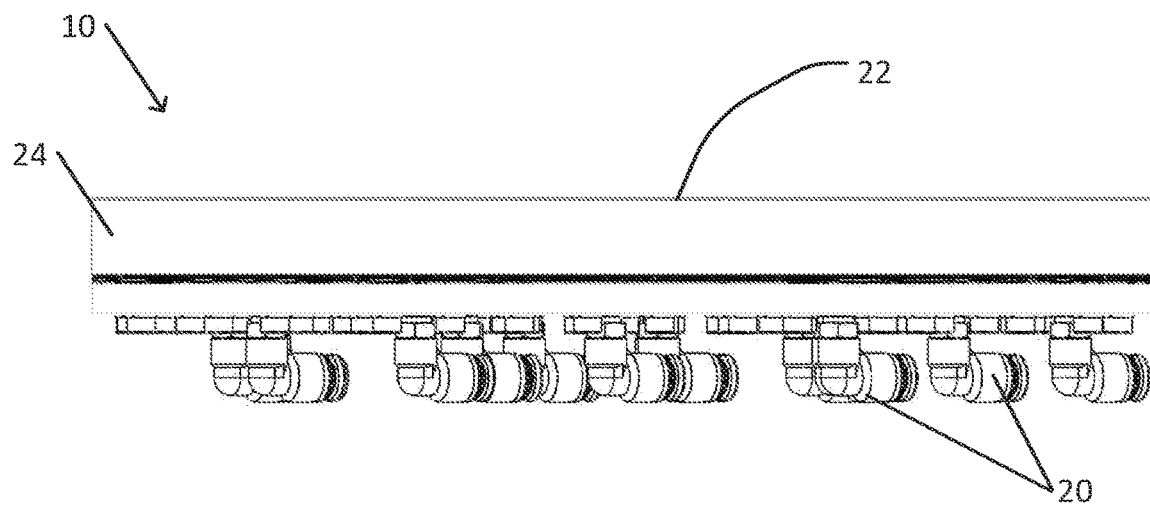
FIG. 1B is a schematic side view of the chuck shown in FIG. 1A.
Figure 1C:
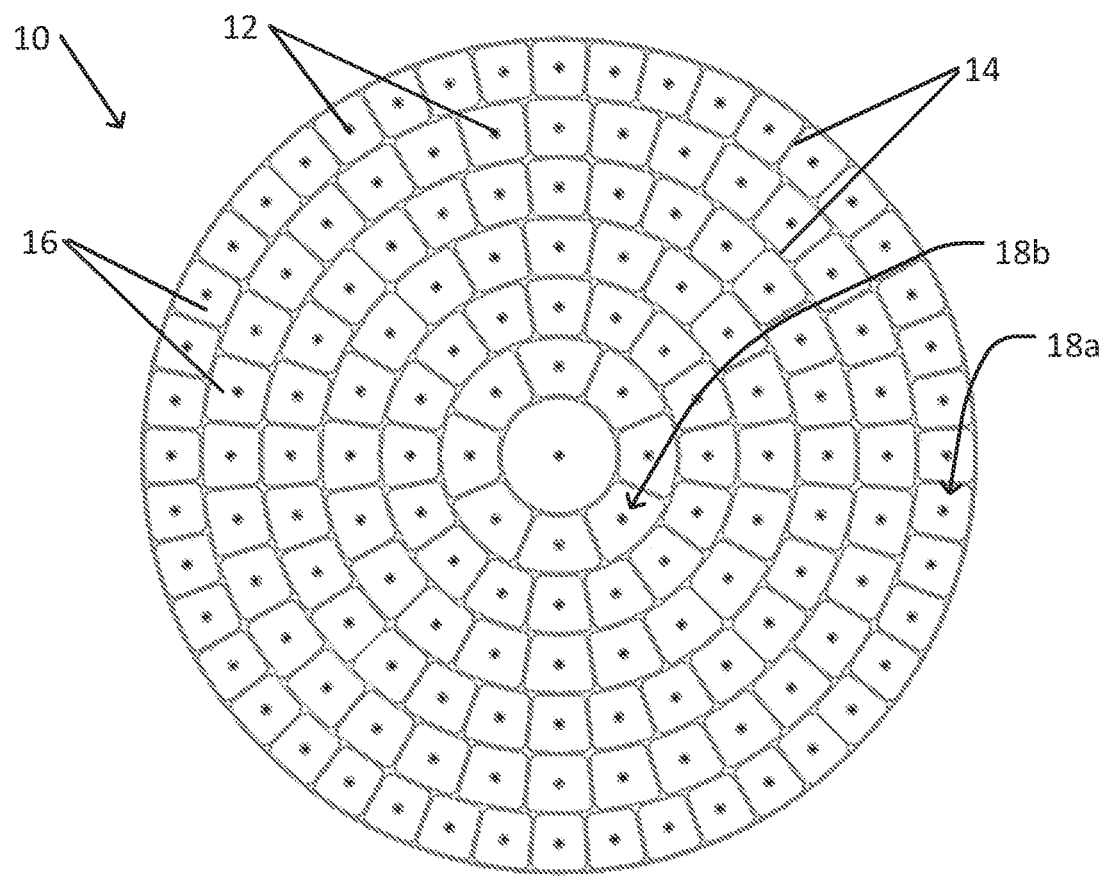
FIG. 1C is a schematic top view of the chuck shown in FIG. 1A.
Figure 1D:
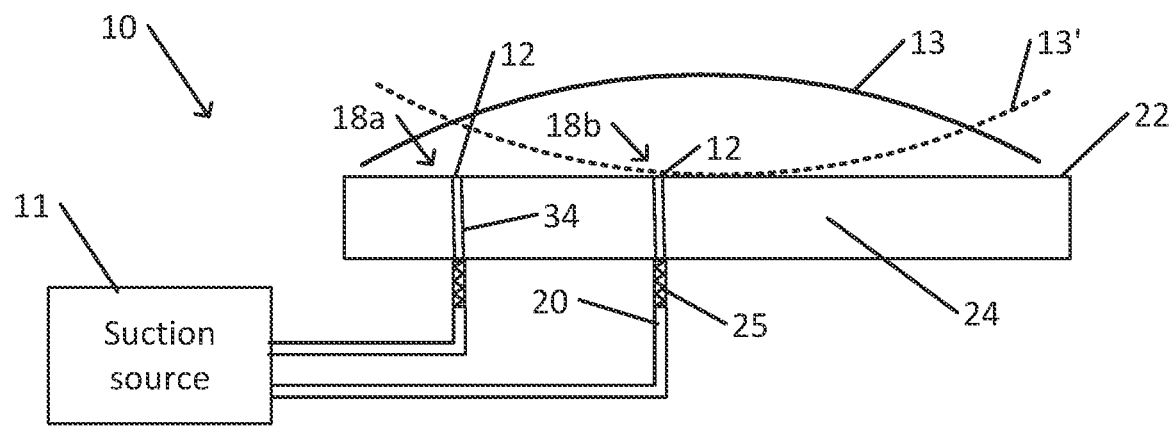
FIG. 1D is a schematic block diagram of the chuck shown in FIG. 1A.

FIG. 1A schematically illustrates a chuck that is configured to flatten a workpiece, according to some embodiments of the invention. FIG. 1B is a schematic side view of the chuck shown in FIG. 1A. FIG. 1C is a schematic top view of the chuck shown in FIG. 1A. FIG. 1D is a schematic block diagram of the chuck shown in FIG. 1A.

Workpiece flattening chuck 10 may be configured to acquire a warped workpiece 13 such that warped workpiece 13 adheres to chuck surface 22. Workpiece flattening chuck 10 may further be configured to flatten warped workpiece 13 onto chuck surface. The flattening may be complete or partial. It may be noted that the warpage of warped workpiece 13 as shown in FIG. 1D has been exaggerated for the purpose of illustration and that the warping has concave curvature. In other examples, the warpage may have another form.

Workpiece flattening chuck 10 is configured to flatten warped workpiece 13 by applying different levels of suction to different regions of warped workpiece 13. In some embodiments, a larger level of suction is applied to a region of warped workpiece 13 that, due to the warpage of warped workpiece 13, is expected to be more distant from chuck surface 22 (e.g., the center of warped workpiece 13 in FIG. 1D). On the other hand, the level of applied suction that is applied to a region of warped workpiece 13 that is closer to, or in contact with, chuck surface 22 (e.g., the ends of warped workpiece 13 in FIG. 1D) may be smaller. The increased suction that is applied to a region of warped workpiece 13 that is initially more distant from chuck surface 22 than another region of warped workpiece 13 may be expected to pull the more distant region of warped workpiece 13 toward chuck surface 22. On the other hand, the relatively lower level of suction that is applied to a region of warped workpiece 13 that is originally located near chuck surface 22 may be sufficient to merely maintain contact of that region with chuck surface 22. Thus, the increased inward pulling that is applied to a region of warped workpiece 13 that was initially more distant from chuck surface 22 may tend to flatten warped workpiece 13 against chuck surface 22. A plurality of vacuum ports 12 are distributed over chuck surface 22. Each vacuum port 12 is open to a conduit 34. Each conduit 34 (e.g., internal to chuck body 24) is connected to one or more of suction connectors 20. Each suction connector 20 may be connected to a suction source 11. For example, suction source 11 may include a pump, blower, vacuum ejector (e.g., water aspirator), or other type of suction source. Thus, each vacuum port is connectable to suction source 11.

Each vacuum port 12 may be surrounded by raised ridges 14 to form a surface cell 16. Thus, when a region of a surface of warped workpiece 13 is acquired by workpiece flattening chuck 10, that region of warped workpiece 13 may cover a surface cell 16 and lie against raised ridges 14 of that surface cell 16. Thus, when a surface cell 16 is covered by a region of warped workpiece 13, the acquired region of warped workpiece 13, raised ridges 14, and the section of chuck surface 22 that is surrounded by raised ridges 14 may form walls of an enclosed volume that may be evacuated by the suction that is applied to vacuum port 12 of that surface cell 16.

In some embodiments, the thicknesses, heights, and spacing among raised ridges 14 may be designed to enable firm acquisition of warped workpiece 13 while avoiding excessive contact area between the surface of warped workpiece 13 and raised ridges 14, and while also avoiding excessive local bending of warped workpiece 13. For example, a user of flattening chuck 10 may require that no more than a predetermined fraction of the surface (e.g., 10% or another fraction) of warped workpiece 13 be in contact with raised ridges 14. In another example, the surface of warped workpiece 13 after acquisition and flattening may be restricted to flatness within a predetermined limit (e.g., 1 μm or another limit). Such requirements may, in consideration of other parameters, such as suction level, determine limits regarding sizing and spacing of raised ridges 14. Other constraints may be imposed by considerations such as manufacturability of workpiece flattening chuck 10, as well as manufacturing cost.

In some cases, a single surface cell 16 that is surrounded by raised ridges 14 may include two or more vacuum ports 12.

One or more of suction connectors 20, vacuum ports 12, or conduits 34 may incorporate one or more flow restrictors 25. Each flow restrictor 25 is designed to provide resistance to flow between a suction connector 20 and a vacuum port 12. For example, flow restrictor 25 may include a SASO, a constriction, baffles, or another type of flow restrictor.

Surface cells 16 that are distributed on chuck surface 22 may be divided into a plurality of cell groups 18 of surface cells 16. The vacuum ports 12 of the surface cells 16 within each cell group 18 are connected to suction source 11 via flow restrictors 25 with substantially identical (e.g., within predetermined limits) flow resistances. Typically, each cell group 18 includes neighboring surface cells 16, where each surface cell 16 shares a common bordering raised ridge 14 with at least one other surface cell 16 in that cell group 18. Thus, vacuum ports 12 of each cell group 18 cover a contiguous region of chuck surface 22. In some embodiments, the flow resistance in a cell group 18 is designed to be relatively low where the vacuum ports 12 of that cell group 18 are expected to apply relatively high suction to the surface of warped workpiece 13. For example, lower flow resistance may be provided to vacuum ports 12 of a cell group 18 where warpage of warped workpiece 13 is expected to increase the distance between a local region of warped workpiece 13 that covers that cell group 18 and chuck surface 22. The increased suction may be expected to pull that local region of warped workpiece 13 toward chuck surface 22, thus reducing the warpage. On the other hand, the flow resistance in a cell group 18 is designed to be relatively high where the vacuum ports 12 of that cell group 18 are expected to apply relatively low suction to the surface of warped workpiece 13. For example, higher flow resistance may be provided to vacuum ports 12 of a cell group 18 where warpage of warped workpiece 13 is expected to bring a local region of warped workpiece 13 that covers that cell group 18 relatively close to, or in contact with, to chuck surface 22. The lower applied suction may maintain contact between that near local region and raised ridges 14 of that cell group 18 as the higher suction in another cell group 18 pulls a more distant region of warped workpiece 13 toward raised ridges 14 and chuck surface 22 in that other cell group 18.

In the embodiment shown, chuck surface 22 is circular (e.g., designed to hold and manipulate a circular warped workpiece 13), and surface cells 16 and vacuum ports 12 are arranged in a series of contiguous concentric circles so as to cover chuck surface 22. In other examples, surface cells 16 may be otherwise arranged, and chuck surface 22 may be otherwise shaped. For example, surface cells 16 on a circular chuck surface 22 may be arranged in parallel rows, may be arranged in distinct circle sectors, or may be arranged in another way. Surface cells 16 of an otherwise shaped chuck surface 22 (e.g., oval, polygonal, or otherwise) may be arranged in a pattern that is designed to fill that chuck surface 22. The arrangement of surface cells 16 is typically designed to facilitate application of different levels of suction to different regions of a warped workpiece 13 that is held to that chuck surface 22.

For example, workpiece flattening chuck 10 may be configured to flatten a warped workpiece 13 with concave curvature along two axes, as viewed from chuck surface 22 (e.g., a domed workpiece when viewed from the side of the workpiece that is opposite the side that faces chuck surface 22, similar to the curvature of the example of warped workpiece 13 shown in FIG. 1D). In this case, when warped workpiece 13 is initially placed on chuck surface 22, the surface of warped workpiece 13 is nearest to chuck surface 22 at the periphery of chuck surface 22. The surface of warped workpiece 13 is most distant from chuck surface 22 near the center of chuck surface 22.

In this case, surface cells 16 may be advantageously divided into cell groups 18, where each cell group 18 includes one of the concentric circles of surface cells 16 in the example shown. Therefore, surface cells 16 that are arranged in one of cell groups 18, such as outer circular group 18a or inner circular group 18b, are all connected to suction source 11 via a single set of one or more flow restrictors 25, or via different but substantially mutually equivalent sets of flow restrictors 25. In order for a warped workpiece 13 with concave curvature to be flattened, the level of suction that is applied to inner circular group 18b may be greater than the level of suction that is applied to outer circular group 18a. For example, the flow resistance of a flow restrictor 25 that is placed between suction source 11 and each vacuum port 12 within outer circular group 18a may be greater than the flow resistance of a flow restrictor 25 that is placed between suction source 11 and each vacuum port 12 within inner circular group 18b. The values of the flow resistance of the flow restrictors 25 of each cell group 18 decrease from the periphery of chuck surface 22 toward the center of chuck surface 22. The decrease may be arithmetic (e.g., additive), geometric (e.g., multiplicative), exponential, or otherwise. Alternatively or in addition, inner circular group 18b and outer circular group 18a may be connected to different suction sources 11 that provide different levels of suction.

Alternatively, a warped workpiece 13 with concave curvature along two axes may be flattened by ensuring an airtight seal between the outer perimeter of warped workpiece 13 and chuck surface 22. Continued application of suction to warped workpiece 13 may then flatten the region of warped workpiece 13 that is interior to the perimeter against chuck surface 22. In this case, the level of suction that is applied to outer circular group 18b, e.g., at a radius that is approximately equal to the radius of warped workpiece 13, may be greater than the level of suction that is applied to inner circular group 18a and other vacuum ports 12. For example, the flow resistance of a flow restrictor 25 that is placed between suction source 11 and each vacuum port 12 within outer circular group 18a may be less than the flow resistance of a flow restrictor 25 that is placed between suction source 11 and each vacuum port 12 within inner circular group 18b or other vacuum ports 12. Alternatively or in addition, vacuum ports 12 in outer circular group 18a may be connected to a suction source 11 that provides a greater level of suction than a suction source 11 to which the other vacuum ports 12 are connected.

In some embodiments of the invention, workpiece flattening chuck 10 may be configured to flatten a warped workpiece with convex curvature along two axes, as viewed from chuck surface 22 (e.g., a bowl-shaped workpiece when viewed from the side of the workpiece that is opposite the side that faces chuck surface e.g., similar to convexly warped workpiece 13' shown in FIG. 1D). When convexly warped workpiece 13' is initially placed on chuck surface 22, the surface of convexly warped workpiece 13' may be in contact with chuck surface 22, e.g., with raised ridges 14 of chuck surface 22, near the center of chuck surface 22. The surface of chuck surface 22, that is most distant from chuck surface 22 is located near the periphery of chuck surface 22. In order for convexly warped workpiece 13' to be flattened, the level of suction that is applied to outer circular group 18a may be greater than the level of suction that is applied to inner circular group 18b. For example, the flow resistance of a flow restrictor 25 that is placed between suction source 11 and each vacuum port 12 within outer circular group 18a may be smaller than the flow resistance of a flow restrictor 25 that is placed between suction source and each vacuum port 12 within inner circular group 18b. The values of the flow resistance of the flow restrictors 25 of each cell group 18 increase from the periphery of chuck surface 22 toward the center of chuck surface 22. The increase may be arithmetic, geometric, exponential, or otherwise.

In some embodiments, the density and distribution of surface cells 16 within each cell group 18 may be depend on the radial distance of each cell group 18 from the center of chuck surface 22. In some embodiments, the level of suction that is applied to vacuum port 12 in cell groups 18 nearer the center of chuck surface 22 may be greater than the level of suction that is applied to vacuum ports 12 in cell groups 18 that are farther from the center. In some embodiments, the suction that is applied to vacuum ports 12 in cell groups 18 that are nearer to the center is lower than the level of suction that is applied to vacuum ports 12 that are in cell groups 18 that are farther from the center.

In some embodiments, the density and distribution of surface cells 16 within each cell group 18 may depend on the angular or azimuthal position of each cell group 18 on chuck surface 22. For example, the level of suction that is applied to vacuum ports 12 within a cell group 18 at one azimuthal position may be greater or less than the level of suction that is applied to vacuum ports 12 in a cell group 18 at another azimuthal position.

For example, where a workpiece flattening chuck 10 is configured to flatten a warped workpiece 13 with concave or convex curvature along a single axis (e.g., in the form of a section of a surface of a cylinder), or parallel regions of varying curvature (e.g., wavy or rippled) vacuum ports 12 may be advantageously divided into cell groups 18 along a plurality of parallel secant lines.

Figure 1E:
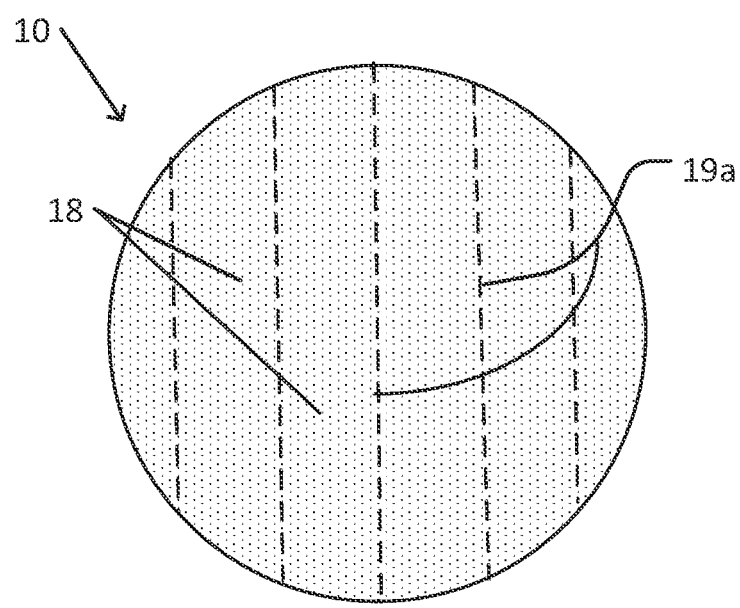
FIG. 1E schematically illustrates a chuck where groups of vacuum ports are divided into groups by parallel secant lines, in accordance with an embodiment of the invention.

FIG. 1E schematically illustrates a chuck where groups of vacuum ports are divided into groups by parallel secant lines, in accordance with an embodiment of the invention.

In the example shown, vacuum ports 12 are divided into cell groups 18 by parallel secant lines 19a. In other examples, workpiece flattening chuck 10 may be square or otherwise shaped. In some examples, the level of suction that is applied to each cell group 18 may vary with distance from a diameter that is parallel to parallel secant lines 19a.

Where a workpiece flattening chuck 10 is configured to flatten a warped workpiece 13 with saddle curvature (e.g., concave curvature along one axis and convex curvature along an intersecting axis) or other multiple curvature along nonparallel axes (e.g., azimuthal rippling), vacuum ports 12 may be advantageously divided into cell groups 18 along a plurality of radii.

Figure 1F:
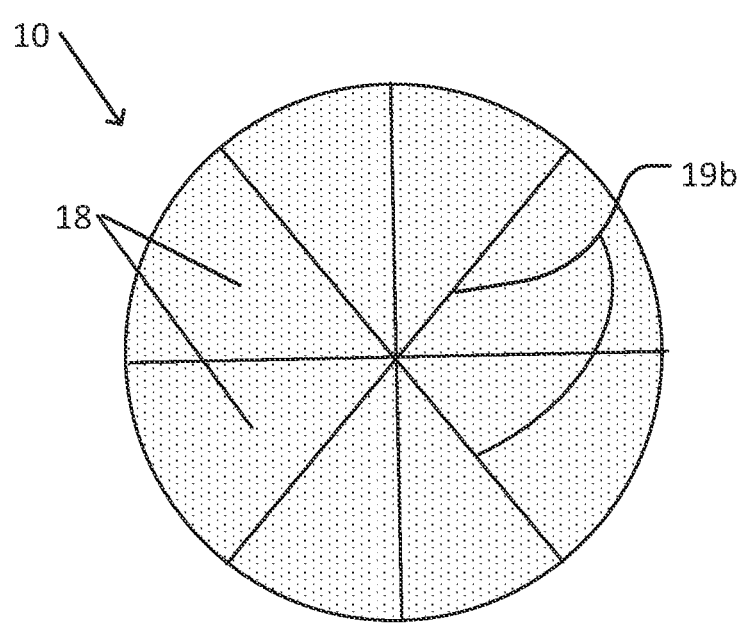
FIG. 1F schematically illustrates a chuck where groups of vacuum ports are divided into groups by radii, in accordance with an embodiment of the invention.

FIG. 1F schematically illustrates a chuck where groups of vacuum ports are divided into groups by radii, in accordance with an embodiment of the invention.

In the example shown, vacuum ports 12 are divided into cell groups 18 by radii 19b. In sortie examples, the level of suction that is applied to vacuum ports in each cell group may vary with angle between cell groups 18 that lie along one axis and those cell groups 18 that lie along a perpendicular axis.

In some examples of a warped workpiece 13, the degree of curvature of the workpiece may vary from location to location on the workpiece. In some cases, the direction of curvature may vary from location to location on the workpiece. For example, a workpiece surface may form a saddle point, may be rippled, dimpled, or otherwise curved. A workpiece flattening chuck 10 may be configured to acquire and flatten a warped workpiece 13 with any such type of warpage.

In some cases, one or more suction connectors 20 or conduits 34 may be provided with valves or other devices for selectively directing inflow through vacuum ports 12 of one or more cell groups 18 through a particular selected flow restrictor 25. In such a case, a workpiece flattening chuck 10 may be configured for a warped workpiece 13 with a particular form of warpage. In some cases, a controller may be configured to receive sensed information describing the warping of a particular warped workpiece, and to adjust the level of suction that is applied to each vacuum port 12 or groups of vacuum ports 12 in order to acquire and flatten that workpiece.

Figure 2A:
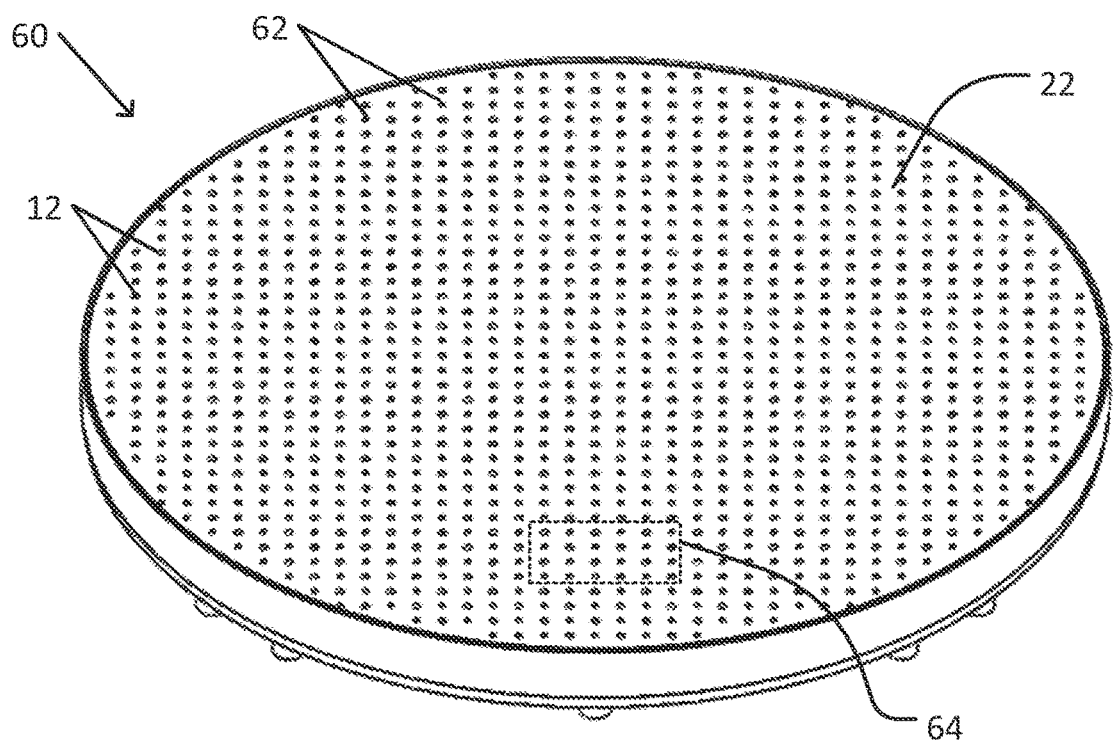
FIG. 2A schematically illustrates a variant of the chuck shown in FIG. 1A that includes projections for preventing contact of a workpiece with the chuck surface.
Figure 2B:
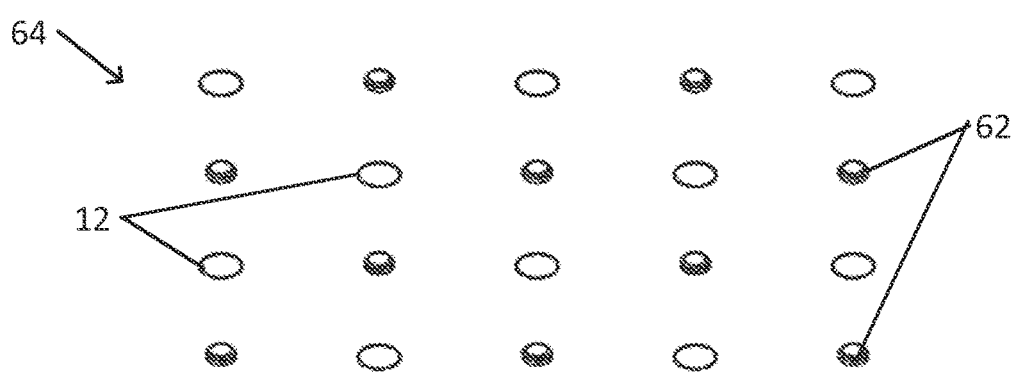
FIG. 2B is an enlarged view of a section of the surface of the chuck shown in FIG. 2A.

FIG. 2A schematically illustrates a variant of the chuck shown in FIG. 1A that includes projections for preventing contact of a workpiece with the chuck surface. FIG. 2B is an enlarged view of a section of the surface of the chuck shown in FIG. 2A.

On chuck surface 22 of chuck 60, vacuum ports 12 are interspersed with projections 62. In the example shown, vacuum ports 12 alternate with projections 62 in a rectangular array pattern. In other examples, vacuum ports 12 and projections 62 may be arranged in another, nonrectangular pattern. In some other examples, the density of the distribution of vacuum ports 12 may be greater than or less than the density of distribution of projections 62. In the example shown, each projection 62 is circular. On other examples, a projection 62 may be otherwise (e.g., oval, polygonal, or otherwise) shaped.

The diameter or other lateral dimension (e.g., length, width, or other lateral dimension) of each projection 62 may be designed such that a maximum permitted area of contact between each projection 62 and a workpiece is not exceeded. Similarly, the distribution of projections 62 on chuck surface 22 may be designed such that the area of contact between the workpiece and projections 62 within a region of chuck surface 22 does not exceed a maximum permitted area of contact within that region.

Spacing among projections 62 may be designed such that bending of the workpiece by vacuum ports 12 between two projections 62 does not result in contact between the workpiece and chuck surface 22, or does not exceed a maximum permitted local betiding (e.g., as specified by a maximum permitted curvature, maximum permitted differences in distance from chuck surface 22, or otherwise) between projections 62.

In some embodiments, one or more of vacuum ports 12 may be provided with an extendible and retractable tube structure in order to facilitate acquisition of a warped workpiece 13.

Figure 2C:
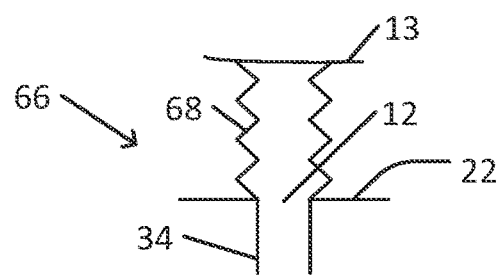
FIG. 2C schematically illustrates a cross section of a vacuum port with an extendible and retractable tube structure for facilitating acquisition of a workpiece.

FIG. 2C schematically illustrates a cross section of a vacuum port with bellows structure for facilitating acquisition of a workpiece.

In the example shown, port assembly 66 includes conduit 34, vacuum port 12 and extendible tube 68. Conduit 34, vacuum port 12 and extendible tube 68 may be circular, or one or more of the components of port assembly 66 may have another shape.

In the example shown, extendible tube 68 has a bellows shape with accordion folds that enables the length of extendible tube 68 to change. In other examples, an extendible tube may be otherwise configured (with a weave structure or otherwise stretchable and shrinkable material, with telescoping segments, or otherwise) to change its length.

Extendible tube 68 may be typically configured to extend outward from chuck surface 22 when in an equilibrium state (e.g., not subjected to any stretching or compressing forces). When warped workpiece 13 comes into contact with a distal end of extendible tube 68, as in the example shown, a seal may form between extendible tube 68 and warped workpiece 13. As a result of the suction that is applied to vacuum port 12, warped workpiece 13 is pulled toward chuck surface 22, compressing (e.g., partially collapsing) and shortening extendible tube 68. In the example shown, the accordion structure of extendible tube 68 is compressed to fold the accordion structure.

The inward pulling of warped workpiece 13 may be limited by projections 62, by raised ridges 14, by a minimum compressed length of extendible tube 68, or otherwise. The inward pulling of extendible tube 68 may facilitate acquisition of warped workpiece 13 by other vacuum ports 12 (e.g., provided with shorter extendible tubes 68 or other sealing structure), thus facilitating acquisition, and possibly flattening, of warped workpiece 13.

Figure 3A:
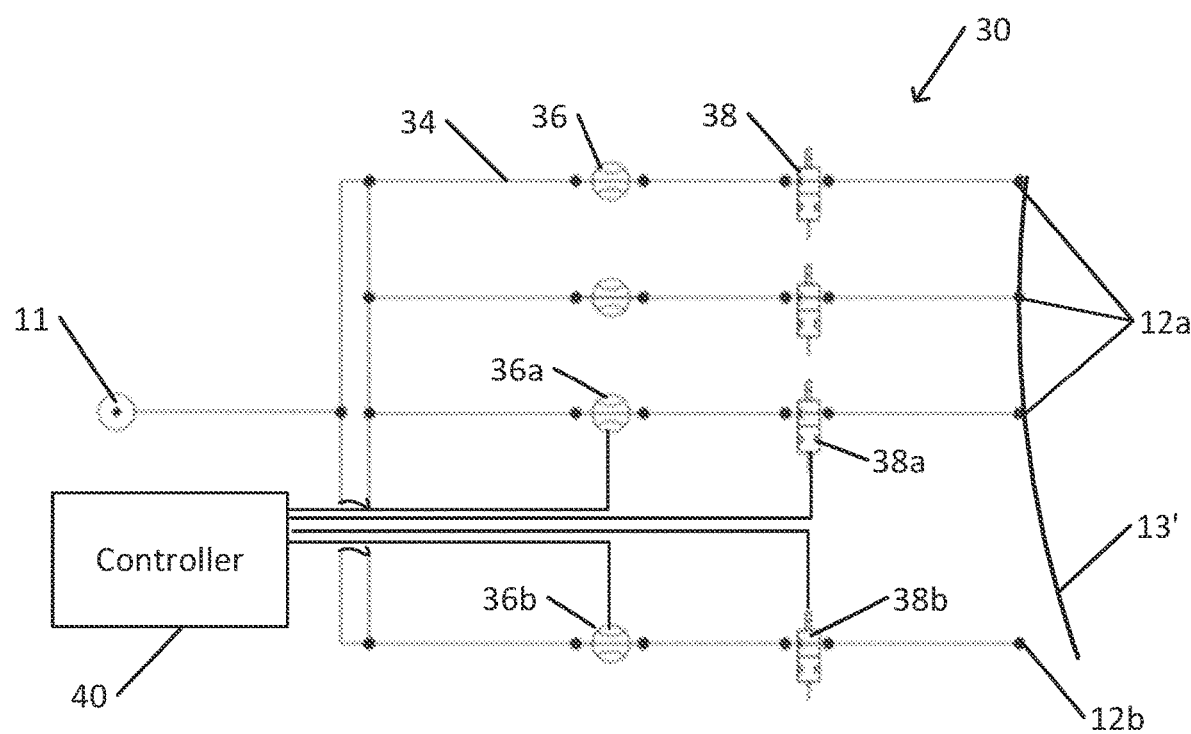
FIG. 3A is a schematic block diagram of the flow control of a chuck that is configured to hold a warped workpiece, according to some embodiments of the invention.

FIG. 3A is a schematic block diagram of a chuck that is configured to adjust inflow to hold a warped workpiece.

In adjustable inflow chuck 30, each conduit 34 that connects one or more (e.g., neighboring) vacuum ports 12 with suction source 11 includes at least one inflow sensor 36 and at least one valve 38. Controller 40 is configured to operate one or more valves 38 based on inflow data that is sensed by one or more inflow sensors 36.

For example, controller 40 may include circuitry or one or more processors that are configured to control operation of valves 38 in accordance with signals that are received from inflow sensors 36. Controller 40 may include a circuitry or a processor that is incorporated into, or otherwise dedicated to operation of, adjustable inflow chuck 30. In other examples, controller 40 may be incorporated into, e.g., may represent a software module or program of, a controller that is configured to operate a system that incorporates adjustable inflow chuck 30 for the purpose of processing workpieces such as warped workpiece 13. For the sake of clarity, connections between controller 40 and only some of inflow sensors 36 and valves 38 are indicated in FIG. 3A.

A signal that is generated by each inflow sensor 36, and that is indicative of inflow through that conduit 34, may be received by controller 40. For example, inflow sensor 36 may include one or more of a pressure sensor, flow sensor, or other sensor that may be utilized to determine a rate of inflow through one or more vacuum ports 12 that are connected to a conduit 34 that includes inflow sensor 36.

For example, when a vacuum port 12 has acquired a region of warped workpiece 13, that region of warped workpiece 13 may form a seal that prevents further inflow through that vacuum port 12. Thus, a flowmeter of inflow sensor 36 may indicate a reduction in flow. When inflow is blocked, a pressure sensor of inflow sensor 36 may indicate a reduction in fluid pressure to below atmospheric pressure (vacuum) due to evacuation of conduit 34 by suction source 11.

Controller 40 may be configured to detect when inflow via a vacuum port 12 or conduit 34 by comparing the sensed rate of inflow with a threshold level, e.g., by a low sensed flow rate or high sensed vacuum level. On the other hand, when, e.g., after a predetermined period of time, the rate of inflow as indicated by inflow sensor 36 remains higher than the threshold level (e.g., by a high sensed flow rate or relatively high sensed fluid pressure), controller 40 may determine that the associated vacuum port 12 has not been blocked and has not acquired warped workpiece 13.

Controller 40 may determine that a sufficient number of vacuum ports 12, such as covered vacuum ports 12a as sensed by one or more inflow sensors 36a, in the example shown, have acquired warped workpiece 13 in order to reliably manipulate warped workpiece 13. For example, the number of covered vacuum ports 12a that are required to acquire warped workpiece 13 may be determined in accordance with characteristics of warped workpiece 13, such as its mass, size, surface properties, or other characteristic, and of the type of processing that is to be applied to warped workpiece 13 when held by adjustable inflow chuck 30. Other vacuum ports 12, such as uncovered vacuum port 12b in the example shown, may be determined based on a signal received from one or more inflow sensors 36b, to have not acquired warped workpiece 13.

When warped workpiece 13 has thus been acquired by adjustable inflow chuck 30, controller 40 may close one or more valves 38b to stop inflow through some or all of uncovered vacuum ports 12b, which have not acquired warped workpiece 13. For example, a valve 38 may include a solenoid valve or another type of electronically controllable valve. Valves 38a that are connected to covered vacuum ports 12a remain open. Therefore, the suction that is generated by suction source 11 is applied solely to covered vacuum ports 12a, without drawing in air through uncovered vacuum ports 12b. This selective application of the suction to covered vacuum ports 12a only may increase the strength of the holding force that is applied to warped workpiece 13 via covered vacuum ports 12a.

In some embodiments, some but not all of valves 38b may be closed. In this manner, the suction that is applied to uncovered vacuum ports 12b whose valves 38b remain open may be increased to facilitate acquisition of warped workpiece 13 by those uncovered vacuum ports 12b with open valves 38b.

One or more vacuum ports 12 may be configured to facilitate acquisition of warped workpiece 13 by vacuum port 12.

Figure 3B:
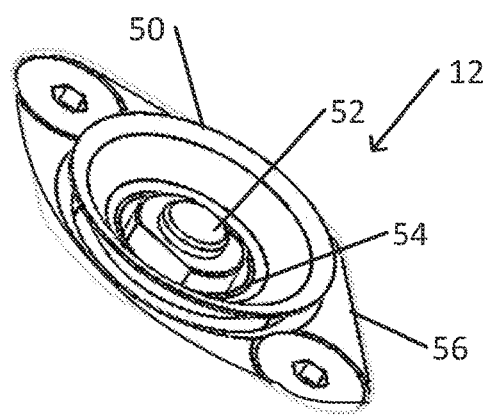
FIG. 3B schematically illustrates a vacuum port of the chuck shown in FIG. 3A.

FIG. 3B schematically illustrates a vacuum port of the chuck shown in FIG. 3A.

In the example shown, vacuum port 12 includes suction opening 54 surrounded by flexible cup 50 mounted on base 56 (e.g., which may be made of a rigid material such as a metal and which may be bolted to the surface of adjustable inflow chuck 30). When suction source 11 applies suction to suction opening 54, a warped workpiece 13 placed near flexible cup 50 may cover flexible cup 50 and be drawn inward toward suction opening 54. Contact between warped workpiece 13 and flexible cup 50 may form a seal that enhances suction and friction forces on adjustable inflow chuck 30. Port pin 52 is located within suction opening 54. Port pin 52 (e.g., made of polyether ether ketone (PEEK), or a similar substance that resists degradation) may limit local bending of a region of warped workpiece 13 that is acquired by vacuum port 12, and may ensure that suction opening 54 remains unblocked.

Alternatively or in addition, some or all of vacuum ports 12 of adjustable inflow chuck 30 may be in the form of a port assembly 66 that includes an extendible tube 68, e.g., as schematically illustrated in FIG. 2C, may be surrounded by raised ridges 14, or may be otherwise provided with sealing structure.

Figure 4:
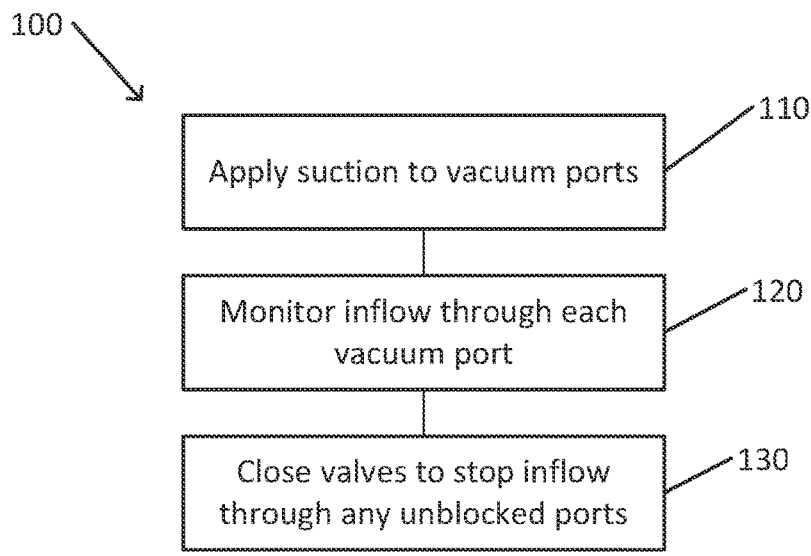
FIG. 4 is a flowchart depicting a method of operation of the chuck shown in FIG. 3A.

FIG. 4 is a flowchart depicting a method of operation of the chuck shown in FIG. 3A.

It should be understood, with respect to any flowchart referenced herein, that the division of the illustrated method into discrete operations represented by blocks of the flowchart has been selected for convenience and clarity only. Alternative division of the illustrated method into discrete operations is possible with equivalent results. Such alternative division of the illustrated method into discrete operations should be understood as representing other embodiments of the illustrated method.

Similarly, it should be understood that, unless indicated otherwise, the illustrated order of execution of the operations represented by blocks of any flowchart referenced herein has been selected for convenience and clarity only. Operations of the illustrated method may be executed in an alternative order, or concurrently, with equivalent results. Such reordering of operations of the illustrated method should be understood as representing other embodiments of the illustrated method.

Chuck operation method 100 may be executed by controller 40 of adjustable inflow chuck 30. For example, execution of chuck operation method 100 may be initiated by controller 40 when adjustable inflow chuck 30 is to acquire a new workpiece such as warped workpiece 13.

When adjustable inflow chuck 30 is brought into the vicinity of warped workpiece 13, e.g., as controlled by a controller of a system for processing workpieces, suction from suction source 11 is applied to vacuum ports 12 (block 110). Valves 38 in conduits 34 leading to all vacuum ports 12 to which the suction is to be applied may be opened. The vacuum ports 12 to be opened may include all vacuum ports 12 on adjustable inflow chuck 30, or a subset of these (e.g., where a size of warped workpiece 13 is smaller than the surface of adjustable inflow chuck 30 or where the weight of warped workpiece 13 enables grasping with fewer vacuum ports 12).

As suction is applied to vacuum ports 12, inflow through each vacuum port 12 (or through a group of vacuum ports 12) is monitored using inflow sensors 36 (block 120). After a predetermined time period (e.g., sufficiently long to enable full acquisition of warped workpiece 13 by at least some of vacuum ports 12), controller 40 may apply predetermined inflow criteria (e.g., flowrate or pressure criteria, e.g., a threshold flowrate or pressure) to distinguish between a vacuum port 12 that has acquired warped workpiece 13 and one that has not.

Inflow sensors 36 may indicate reduced inflow through some vacuum ports 12, indicating acquisition of warped workpiece 13 by those vacuum ports 12, while inflow through other vacuum ports 12 is not reduced, the non-reduced inflow indicating that those vacuum ports 12 have failed to acquire warped workpiece 13. In this case, controller 40 may close some of valves 38 to disable inflow through those vacuum ports 12 that have not acquired warped workpiece 13 (block 130). The disabled inflow through the vacuum ports 12 that have not acquired warped workpiece 13 may enhance the grip on warped workpiece 13 by those vacuum ports 12 that have acquired warped workpiece 13.

Adjustable inflow chuck 30 may then be operated to manipulate warped workpiece 13, e.g., during processing of warped workpiece 13.

In another embodiment, a method of operation may include disabling inflow through a fraction of those vacuum ports 12 that have not acquired warped workpiece 13.

Figure 5:
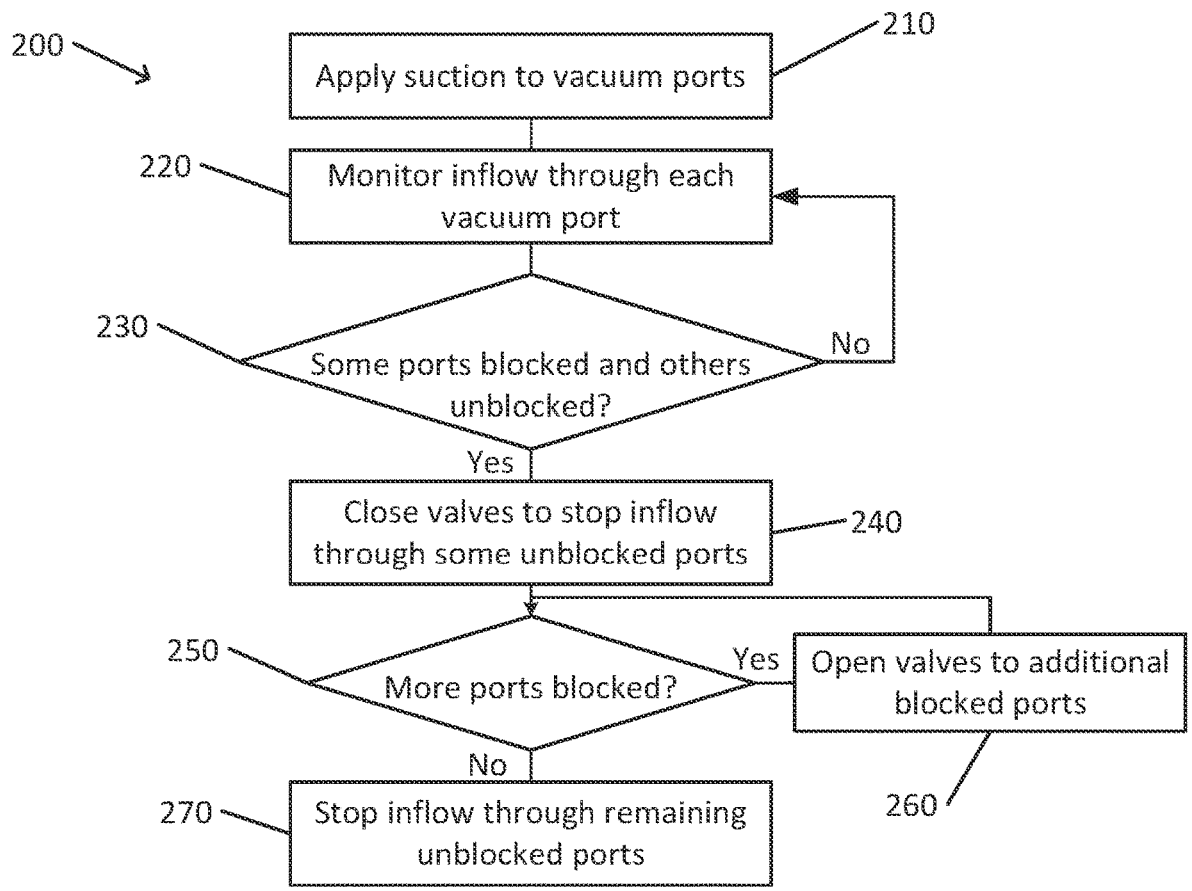
FIG. 5 is a flowchart depicting a variant of the method of operation depicted in FIG. 4.

FIG. 5 is a flowchart depicting a variant of the method of operation depicted in FIG. 4.

Chuck operation method 200 may be executed by controller 40 of adjustable inflow Chuck 30. For example, execution of chuck operation method 200 may be initiated by controller 40 when adjustable inflow chuck 30 is to acquire a new workpiece such as warped workpiece 13.

When adjustable inflow chuck 30 is brought into the vicinity of warped workpiece 13, e.g., as controlled by a controller of a system for processing workpieces, suction from suction source 11 is applied to vacuum ports 12 (block 210). Valves 38 in conduits 34 leading to all vacuum ports 12 to which the suction is to be applied may be opened.

As suction is applied to vacuum ports 12, inflow through each vacuum port 12 (or through a group of vacuum ports 12) is monitored using inflow sensors 36 (block 220).

After a predetermined time period (e.g., sufficiently long to enable full acquisition of warped workpiece 13 by at least some of vacuum ports 12), controller 40 may apply predetermined inflow criteria (e.g., flowrate or pressure criteria) to distinguish between a vacuum port 12 that has acquired warped workpiece 13 and one that has not. For example, a flowrate sensed by a flowmeter that is less than a predetermined threshold flowrate, or a fluid pressure (e.g., below atmospheric pressure) sensed by a pressure sensor that is below a predetermined threshold pressure level, may be considered to be indicative of acquisition of warped workpiece 13 by a vacuum port 12.

If all of vacuum ports 12 are blocked or all are unblocked (block 230), indicating full acquisition by all vacuum ports 12 of warped workpiece 13, or failure of all to acquire warped workpiece 13 (e.g., indicative of excessive distance between warped workpiece 13 and chuck surface 22), monitoring continues (block 220).

In some cases, controller 40 may determine that some of vacuum ports 12 are blocked, indicating acquisition of warped workpiece 13 by those vacuum ports 12, while other vacuum ports 12 are unblocked, indicating failure of those vacuum ports 12 to acquire warped workpiece 13 (block 230).

Controller 40 may close some of valves 38 to disable inflow through a nonzero fraction of those vacuum ports 12 that have not acquired warped workpiece 13 (block 240). For example, controller 40 may apply predetermined criteria to determine the number and locations of those vacuum ports 12 that are to be closed. This disabling of inflow through some of the vacuum ports 12 that have not acquired warped workpiece 13 may increase the rate of inflow through those unblocked vacuum ports 12 that have not acquired warped workpiece 13. The increased inflow may facilitate acquisition of warped workpiece 13 by those unblocked vacuum ports 12 that have not yet acquired warped workpiece 13.

Continued monitoring of inflow through those unblocked vacuum ports 12 that have not been disabled may compare a current number of blocked vacuum ports 12 with the number of previously unblocked vacuum ports 12 (block 250).

If the number of blocked vacuum ports 12 is determined to have increased, then some of valves 38 that had been previously disabled by closing (in the operation represented by block 240) may be reopened (block 260). Continued monitoring may detect whether sortie of these additional reopened vacuum ports 12 become blocked due to acquisition of warped workpiece 13 by those vacuum ports 12 (returning to block 250).

After one or more repeats of the operations of block 250, it may be determined that the number of blocked vacuum ports 12 that have acquired warped workpiece 13 has not increased. In this case, controller 40 may close valves 38 to disable inflow through all vacuum ports 12 that have not acquired warped workpiece 13 (block 270). The disabled inflow through the vacuum ports 12 that have not acquired warped workpiece 13 may enhance the grip on warped workpiece 13 by those vacuum ports 12 that have acquired warped workpiece 13. Adjustable inflow chuck 30 may then be operated to manipulate warped workpiece 13, e.g., during processing of warped workpiece 13.

Different embodiments are disclosed herein. Features of certain embodiments may be combined with features of other embodiments; thus, certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A chuck comprising:
   a chuck surface;
   a plurality of cell groups, each cell group comprising:
      a plurality of cells distributed over the chuck surface, each of the plurality of cells comprising:
         at least one vacuum port, wherein each of the at least one vacuum ports is open to a conduit of a plurality of conduits that are connectable to a suction source that is operable to apply suction to that vacuum port;
      and
      at least one flow restrictor located within each conduit of the plurality of conduits and characterized by a flow resistance, wherein a flow resistance of each of the at least one flow restrictor in at least one conduit of the plurality of conduits connected to a cell group is less than a flow resistance of a flow restrictor in at least one other conduit of the plurality of conduits connected to another cell group.

2. The chuck of claim 1, wherein each cell group covers a contiguous region of the chuck surface, and wherein the flow resistances of the flow restrictors in the conduits that are open to the vacuum ports in each contiguous region are substantially equal.

3. The chuck of claim 2, wherein the plurality of contiguous regions comprises a plurality of concentric circular bands.

4. The chuck of claim 3, wherein the flow resistances of the flow restrictors in each of the conduits that are open to the vacuum ports in an inner concentric circle are less than the flow resistances of the flow restrictors in each of the conduits that are open to the vacuum ports in an outer concentric circle.

5. The chuck of claim 3, wherein the flow resistances of the flow restrictors in each of the conduits that are open to the vacuum ports in an outer concentric circle are less than the flow resistances of the flow restrictors in each of the conduits that are open to the vacuum ports in an inner concentric circle.

6. The chuck of claim 1, wherein the flow restrictor is selected from a group of flow restrictors consisting of a constriction, a baffle and a self-adapting segmented orifice (SASO).

7. The chuck of claim 1, wherein a vacuum port of the plurality of vacuum ports includes an extendible tube whose distal end is configured to form a seal when in contact with the workpiece, and that is configured to be compressible by the suction after formation of the seal.

8. The chuck of claim 7, wherein the extendible tube is in the form of a bellows with accordion folds.

9. The chuck of claim 1, wherein each of the plurality of cells further comprises surrounding raised ridges.

* * * * *